United States Patent
Gilbert et al.

(10) Patent No.: US 10,012,703 B2
(45) Date of Patent: Jul. 3, 2018

(54) BATTERY CHARGER MODULE FOR CHARGING A VEHICLE BATTERY AND METHOD FOR DETERMINING A STATE OF AN AC POWER SUPPLY AT A BATTERY CHARGER MODULE

(71) Applicant: Lear Corporation, Southfield, MI (US)

(72) Inventors: Carl L. Gilbert, Southfield, MI (US); Michael Scott Gibbons, Garden City, MI (US)

(73) Assignee: Lear Corporation, Southfield, MI (US)

( * ) Notice: Subject to any disclaimer, the term of this patent is extended or adjusted under 35 U.S.C. 154(b) by 289 days.

(21) Appl. No.: 14/067,246

(22) Filed: Oct. 30, 2013

(65) Prior Publication Data

US 2015/0115995 A1    Apr. 30, 2015

(51) Int. Cl.
| | |
|---|---|
| H02J 7/04 | (2006.01) |
| G01R 31/42 | (2006.01) |
| H02J 5/00 | (2016.01) |
| H02J 7/02 | (2016.01) |
| B60L 11/18 | (2006.01) |

(52) U.S. Cl.
CPC .......... *G01R 31/42* (2013.01); *B60L 11/1861* (2013.01); *B60L 11/1879* (2013.01); *H02J 5/00* (2013.01); *H02J 7/02* (2013.01); *Y02T 10/705* (2013.01); *Y02T 10/7005* (2013.01); *Y02T 10/7044* (2013.01)

(58) Field of Classification Search
USPC ....................................................... 320/161
See application file for complete search history.

(56) References Cited

U.S. PATENT DOCUMENTS

| | | | |
|---|---|---|---|
| 7,332,829 B2 | 2/2008 | Takagi et al. | |
| 7,742,885 B2 * | 6/2010 | Oohasi .................. | B60L 3/0038 320/137 |
| 2006/0176059 A1 * | 8/2006 | Mir ....................... | G01R 31/343 324/503 |
| 2009/0315518 A1 | 12/2009 | Soma et al. | |
| 2012/0020118 A1 * | 1/2012 | Takaki .................... | H02M 1/32 363/16 |
| 2012/0249112 A1 * | 10/2012 | Langeslag ........... | H02M 3/1563 323/311 |

FOREIGN PATENT DOCUMENTS

CN    1099192 A    2/1995

* cited by examiner

*Primary Examiner* — Robert Grant
(74) *Attorney, Agent, or Firm* — Brooks Kushman P.C.

(57) ABSTRACT

A battery charger module to be mounted in a vehicle for charging a vehicle battery is disclosed. The battery charger module may include a capacitor, and a direct current (DC) voltage sensor configured to sense a DC voltage across the capacitor. The battery charger module may further include a controller configured to compare the sensed voltage to a voltage threshold, and to determine that an alternating current (AC) power supply is unstable if the sensed voltage fails to exceed the voltage threshold. A method is also disclosed for determining a state of an AC electrical power supply at a battery charger module for charging a vehicle battery. The method may include sensing a DC voltage across a capacitor, comparing the sensed voltage to a voltage threshold, and determining that the AC power supply is unstable when the sensed voltage fails to exceed the voltage threshold.

17 Claims, 2 Drawing Sheets

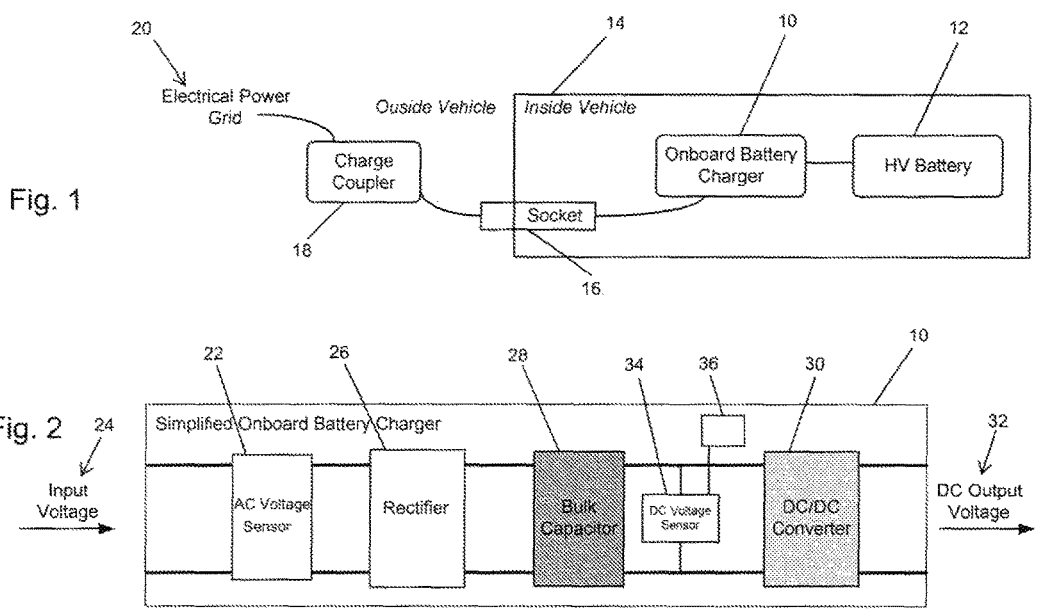

BATTERY CHARGER MODULE FOR CHARGING A VEHICLE BATTERY AND METHOD FOR DETERMINING A STATE OF AN AC POWER SUPPLY AT A BATTERY CHARGER MODULE

TECHNICAL FIELD

The following relates to a battery charger module for charging a high-voltage (HV) vehicle battery in an electric vehicle (EV) or a plug-in electric vehicle with a gasoline engine (PHEV), and a method for determining a state of an alternating current (AC) electrical power supply, source or input voltage at a battery charger module for charging a HV battery in an EV or PHEV.

BACKGROUND

An automotive vehicle powered fully or partially by an electric motor may be referred to as an electric vehicle (EV) or a plug-in electric vehicle with a gasoline engine (PHEV). As is well known in the art, such vehicles include a high-voltage (HV) battery or batteries for supplying power to the electric motors thereof.

Such electric vehicles typically provide for charging such HV batteries using a battery charger module mounted on-board the vehicle. The on-board battery charger module may be supplied with 85 to 265 volt alternating current (AC) power through a vehicle charge socket configured to interface with a charge coupler that is in communication with an electrical utility power grid. The on-board battery charger module is provided in communication with the vehicle HV batteries, and is configured to rectify electrical power from the utility AC power grid for storage by the vehicle HV batteries.

For the on-board battery charger module to perform its main function, AC electric power is required at the input to the module. Sensors are normally used to measure the voltage and current levels of the AC power supplied to the module. EV and PHEV on-board diagnostics may require that the battery charger module understand and/or verify if an AC voltage sensor associated with the battery charger module is functioning properly.

Electrical power from the AC power grid supply may be interrupted due to a variety of reasons. For example, the AC power supply may be interrupted as a result of instability in the electrical power grid, a fault associated with the charge coupler, a fault associated with the vehicle charge socket, a fault associated with vehicle wiring, or other reasons. These various reasons that may cause an interruption of AC power make it difficult to diagnose whether an AC voltage sensor in the on-board battery charger module is faulty, or whether something outside of the battery charger module is causing an interruption in the AC input voltage.

As a result, problems outside of the on-board battery charger module may cause diagnostics to incorrectly determine that an AC voltage sensor is faulty. Moreover, if such a sensor fails, the on-board battery charger module will not be able to determine if the AC electrical power supply is present and/or stable.

The typical solution to such problems would be to add additional sensors to the on-board battery charger module. However, such additional sensors result in increased cost associated with the battery charger module, with the amount of increased costs depending upon the complexity of the AC voltage sensing circuit (e.g., with or without second zero crossing detection). Additional sensors also require valuable printed circuit board (PCB) space, which is problematic as smaller packages are required for on-board charger modules.

Thus, there exists a need for a battery charger module for an EV or PHEV and an associated method for determining the stability of AC power at the input to the battery charger module. Such a battery charger module and method would determine the stability of AC power at the input to the battery charger module without the need or use of additional AC voltage sensors, thereby avoiding increased costs and packaging space for the battery charger module.

SUMMARY

According to one of the embodiments described herein, a battery charger module is provided to be mounted in a vehicle for charging a vehicle battery. The battery charger module may comprise a capacitor and a direct current (DC) voltage sensor configured to sense a DC voltage across the capacitor. The battery charger module may further comprise a controller configured to compare the sensed voltage to a voltage threshold, and to determine that an alternating current (AC) power supply is unstable if the sensed voltage fails to exceed the voltage threshold.

According to another embodiment described herein, a battery charger module is provided to be mounted in a vehicle for charging a vehicle battery. The battery charger module may comprise a controller configured to compare a sensed direct current (DC) voltage across a capacitor to a voltage threshold, and determine that an alternating current (AC) power supply is unstable if the sensed voltage fails to exceed the voltage threshold.

According to another embodiment described herein, a method is provided for determining a state of an alternating current (AC) electrical power supply at a battery charger module for charging a vehicle battery. The method may comprise sensing a direct current (DC) voltage across a capacitor, and comparing the sensed voltage to a voltage threshold. The method may further comprise determining that the AC power supply is unstable when the sensed voltage fails to exceed the voltage threshold.

A detailed description of these and other embodiments of a battery charger module for charging a vehicle battery in an electric vehicle (EV) or plug-in electric vehicle with a gasoline engine (PHEV) and a method for determining a state of an AC electrical power supply at a battery charger module for charging a vehicle battery in an EV is set forth below together with the accompanying drawings.

BRIEF DESCRIPTION OF THE DRAWINGS

FIG. 1 is a simplified block diagram of an environment for a battery charger module for charging a vehicle battery in an electric vehicle (EV) or plug-in electric vehicle with a gasoline engine (PHEV);

FIG. 2 is a simplified block diagram of an embodiment of a battery charger module for charging a vehicle battery in an EV or PHEV, as described herein.

DETAILED DESCRIPTION

Figure 3:
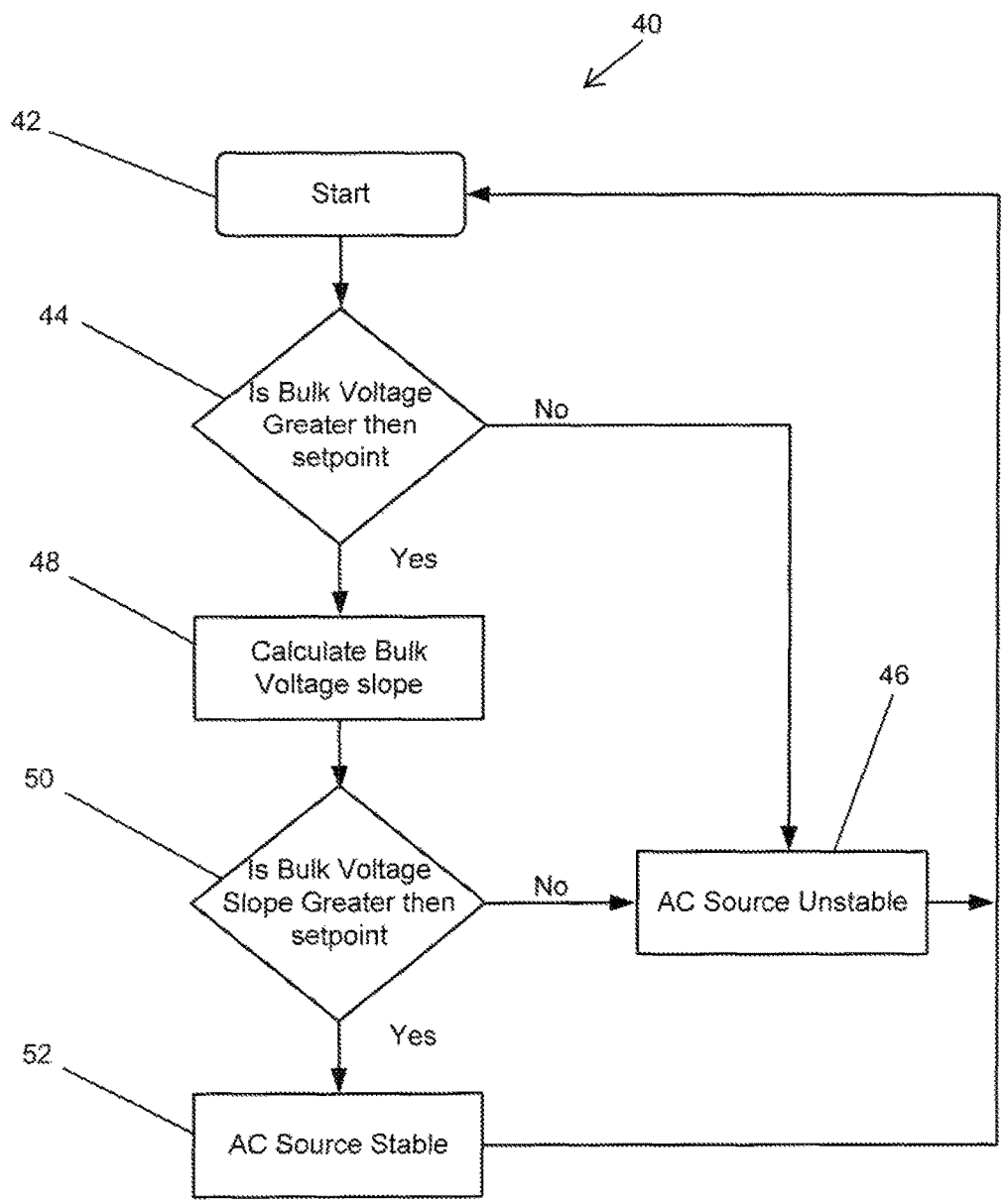
FIG. 3 is a flowchart of a method for determining a state of an AC electrical power supply at a battery charger module for charging a vehicle battery in an EV or PHEV, as described herein.

As required, detailed embodiments are disclosed herein. However, it is to be understood that the disclosed embodiments are merely exemplary and may take various and alternative forms. The figures are not necessarily to scale. Features may be exaggerated or minimized to show details of particular components. Therefore, specific structural and functional details disclosed herein are not to be interpreted as limiting, but merely as a representative basis for teaching one skilled in the art.

With reference to FIGS. 1-3, a more detailed description of embodiments of a battery charger module for charging a vehicle battery in an electric vehicle (EV) or plug-in electric vehicle with a gasoline engine (PHEV), and a method for determining a state of an alternating current (AC) electrical power supply at a battery charger module for charging a vehicle battery in an EV will be described. For ease of illustration and to facilitate understanding, like reference numerals have been used herein for like components and features throughout the drawings.

As previously described, electric vehicles (EV) or plug-in electric vehicles with a gasoline engines (PHEV) include a high-voltage (HV) battery or batteries for supplying power to the electric motors thereof, and typically provide for charging such HV batteries using a battery charger module mounted on-board the vehicle. Referring to FIG. 1, a simplified block diagram is shown of an environment for a battery charger module 10 for charging a vehicle HV battery 12 in an electric vehicle 14.

As seen therein, the battery charger module 10 is adapted to be mounted on-board the EV 14, and may be supplied with alternating current (AC) power through a vehicle charge socket 16 configured to interface with a charge coupler 18 that is provided in communication with an electrical power grid 20. The on-board battery charger module 10 is provided in communication with the vehicle HV battery 12, and is configured to rectify electrical power from the utility AC power grid 20 for storage by the vehicle HV battery 12.

For the on-board battery charger module 10 to perform its main function, AC electric power is required at the input to the module 10. Sensors (see FIG. 2) are normally used to measure the voltage levels of the AC power supplied to the module 10. EV and PHEV on-board diagnostics may require that the battery charger module 10 understand and/or verify if an AC voltage sensor associated with the battery charger module 10 is functioning properly.

Electrical power from the AC power grid supply 20 may be interrupted due to a variety of reasons. For example, the AC power supply may be interrupted as a result of instability in the electrical power grid 20, a fault associated with the charge coupler 18, a fault associated with the vehicle charge socket 16, a fault associated with vehicle wiring (not shown), or other reasons. The various reasons that may cause an interruption of AC power make it difficult to diagnose whether an AC voltage sensor in the on-board battery charger module 10 is faulty, or whether something outside of the battery charger module 10 is causing an interruption in the AC input voltage.

As a result, problems outside of the on-board battery charger module 10 may cause diagnostics to incorrectly determine that an AC voltage sensor is faulty. Moreover, if such a sensor fails, the on-board battery charger module 10 will not be able to determine if the AC electrical power supply is present and/or stable.

The typical solution to such problems would be to add additional sensors to the on-board battery charger module 10. However, such additional sensors result in increased cost associated with the battery charger module 10, with the amount of increased costs depending upon the complexity of the AC voltage sensing circuit (e.g., with or without second zero crossing detection). Additional sensors also require valuable PCB space, which is problematic as smaller packages are required for on-board charger modules 10.

Thus, there exists a need for a battery charger module 10 for an EV or PHEV 14 and an associated method for determining the stability of AC power at the input to the battery charger module. Such a battery charger module 10 and method would determine the stability of AC power at the input to the battery charger module 10 without the need for or use of additional AC voltage sensors, thereby avoiding increased costs and packaging space for the battery charger module 10.

Referring now to FIG. 2, a simplified block diagram is shown of an embodiment of a battery charger module 10 for charging a vehicle HV battery 12 in an EV or PHEV 14 (see FIG. 1). As seen therein, the battery charger module 10 may comprise a voltage sensor 22 for receiving an AC input voltage 24 from the vehicle charge socket 16 (see FIG. 1). The sensor 22 is provided in communication with rectifier 26, which are provided in communication with a bulk capacitor 28. The bulk capacitor 28 is provided in communication with a DC/DC converter 30, which supplies a DC output voltage 32.

Still referring to FIG. 2, the battery charger module 10 may also comprise a direct current (DC) voltage sensor 34 provided in communication with the bulk capacitor 28. DC voltage sensor 34 may also be provided in communication with a controller 36. The controller 36, which may also be referred to as a control unit, may comprise a microcontroller, microprocessor, programmable digital signal processor (DSP) or other programmable device. The controller 36 may alternatively include an ASIC, a programmable gate array or programmable array logic, or a programmable logic device. Where the controller 36 includes a programmable device such as a microprocessor or programmable DSP, the controller 36 may further include computer executable instructions for performing one or more of the various operations and/or functions described herein.

The basic methodology of determining the stability of the AC power supply 24 to the battery charger module 10 is to monitor the bulk capacitor 28. When the AC power supply 24 is stable (or usable), the capacitor 28 will become charged over time. When the AC power supply 24 is unstable (or unusable), the capacitor 28 will become discharged over time. The charge level of the capacitor 28 and the change in that charge level over time (i.e., the slope of the charge level) can be monitored using the DC voltage sensor 34 in order to determine if the AC power supply 24 is stable or unstable.

Moreover, if the charge level of the capacitor 28 is zero (i.e., the capacitor 28 is completely discharged), it can be concluded that the AC power supply is not present. It should be noted here that the DC voltage across the capacitor 28 monitored by the DC voltage sensor 34 is not the same as the DC voltage 32 output by the DC/DC converter 30 and the battery charger module 10.

Thus, the voltage level reading provided by the DC voltage sensor 34 in combination with the slope of that reading can be used to determine if an AC source, supply or input voltage is stable. The DC voltage sensor 34 also acts as a second source to check if the AC voltage sensor 22 is functioning properly. Such a check is also accomplished using the voltage reading provided by the DC voltage sensor 34 in combination with the slope of that voltage reading.

For example, the battery charger module 10 may receive a constant AC input voltage from the electric power grid 20 through the charge coupler 18 and vehicle charge socket 16, but the AC voltage sensor 22 may read 0 volts AC. The battery charger module 10 and method described herein can be used to determine that a fault exists with the AC voltage sensor 22 because the voltage reading provided by the DC voltage sensor 34 indicates that the AC source, supply or input voltage is stable.

In another example, the battery charger module 10 may receive an intermittent AC input voltage from the electric power grid 20 through the charge coupler 18 and vehicle charge socket 16. Since reading and calculating the AC voltage from a waveform can be complex, when this AC signal is also intermittent software may have difficulty determining whether the AC voltage sensor 22 is faulty or the AC signal is intermittent. As a result, on-board diagnostic operations may begin setting one or more fault codes based on a determination that a fault exists with the battery charger module 10 and/or the AC voltage sensor 22. The battery charger module 10 and method described herein use the voltage reading provided by the DC voltage sensor 34, which is a very simple DC measurement, to quickly determine whether the AC power supply is stable or unstable. In the event that a determination is made that the AC power supply is unstable, on-board diagnostic operations may be halted to prevent the unnecessary setting of fault codes.

Referring now to FIG. 3, a flowchart depicts a method 40 for determining a state of an AC electrical power supply at a battery charger module for charging a vehicle battery in an EV or PHEV, as described herein. As seen in FIG. 3, after the start 42 of the method 40, a determination 44 is made whether a bulk voltage is greater than a setpoint or threshold voltage value. If the bulk voltage fails to exceed the setpoint, a determination 46 is made that the AC power supply, source or input voltage is unstable.

Alternatively, if the bulk voltage exceeds the setpoint, a slope of the bulk voltage (i.e., a change in the bulk voltage reading over time) is calculated 48. Thereafter, a determination 50 is made whether the slope of the bulk voltage exceeds a slope setpoint or threshold value. If the slope of the bulk voltage fails to exceed the slope setpoint, a determination 46 is made that the AC power supply, source or input voltage is unstable. Alternatively, if the slope of the bulk voltage exceeds the slope setpoint, a determination 52 is made that the AC power supply, source or input voltage is stable.

As can thus be seen from FIGS. 1-3, a battery charger module 10 is provided for charging a vehicle battery 12, the battery charger module 10 to be mounted in a vehicle 14. The battery charger module 10 may comprise a capacitor 28, and a DC voltage sensor 34 configured to sense a DC voltage across the capacitor 28. The battery charger module may also or alternatively comprise a controller 36 configured to compare the sensed voltage to a voltage threshold, and to determine that an AC power supply, source or input voltage 24 is unstable if the sensed voltage fails to exceed the voltage threshold.

The controller 36 of the battery charger module 10 may be further configured to determine a rate of change of the voltage sensed by the DC voltage sensor 34. The controller 36 may also be configured to compare the rate of change of that sensed voltage to a slope threshold, and to determine that the AC power supply, source or input voltage 24 is unstable if the rate of change of the sensed voltage fails to exceed the slope threshold. The controller 36 may be further configured to determine that the AC power supply, source or input voltage 24 is stable if the rate of change of the sensed voltage exceeds the slope threshold.

In that regard, the rate of change of the voltage sensed by the DC voltage sensor 34 is affected by a variety of empirical factors, including the bank size of the bulk capacitor 28, the bulk capacitive load, and the discharge path. As a result, the slope threshold is configurable, and may be configured based on such factors for each design.

As shown in FIG. 2, the capacitor 28 of the battery charger module 10 may comprise a bulk capacitor. As also seen therein, the capacitor 28 may be configured to receive a DC voltage from a rectifier configured to rectify an AC voltage from the AC power source 24. As previously described, a determination by the controller 36 that the AC power supply is stable may be used to determine a state of the AC voltage sensor 22, such as a fault in the sensor 22. A determination by the controller 36 that the AC power supply is unstable may also be used to halt diagnostic operations associated with the AC voltage sensor 22.

Referring still to FIGS. 1-3, the method 40 for determining a state of an AC electrical power supply at a battery charger module 10 may comprise sensing a DC voltage across a capacitor 28, comparing the sensed voltage to a voltage threshold, and determining that the AC power supply, source or input voltage is unstable when the sensed voltage fails to exceed the voltage threshold. The method 40 may further comprise determining a rate of change of the sensed voltage, comparing the rate of change of the sensed voltage to a slope threshold, and determining that AC power supply, source or input voltage is unstable when the rate of change of the sensed voltage fails to exceed the slope threshold. As previously described such operations or functions may be performed by the controller 36, which may comprise a microcontroller or other programmable device and include appropriate computer executable instructions.

The method 40 may further comprise determining that the AC power supply, source or input voltage is stable when the rate of change of the sensed voltage exceeds the slope threshold. According to the method 40, the capacitor may again comprise a bulk capacitor configured to receive a DC voltage from a rectifier configured to rectify an AC voltage from the AC power supply. As previously described in connection with the battery charger module 10, the rate of change of the voltage sensed by the DC voltage sensor 34 is affected by a variety of empirical factors, including the size of the bulk capacitor bank, the bulk capacitive load, and the discharge path. As a result, the slope threshold is configurable, and may be configured based on such factors for each design.

As also previously described in connection with the battery charger module 10, a determination according to the method 40 that the AC power supply, source or input voltage is unstable may be used to halt diagnostic operations associated with an AC voltage sensor. As well, a determination that the AC power supply, source or input voltage is stable may be used to determine a state of an AC voltage sensor, such as a fault in the AC voltage sensor.

As is readily apparent from the foregoing, embodiments of a battery charger module 10 for charging a high-voltage (HV) vehicle battery 12 in an electric vehicle (EV) or plug-in electric vehicle with a gasoline engine (PHEV) 14 and a method 40 for determining a state of an alternating current (AC) electrical power source at a battery charger module 10 have been described. Such embodiments of a battery charger module 10 and method 40 determine the stability of AC power at the input to the battery charger module 10 without the need for or use of additional AC voltage sensors, thereby avoiding increased costs and packaging space for the battery charger module 10.

While various embodiments of a battery charger module for charging a vehicle battery in an electric vehicle (EV) or plug-in electric vehicle with a gasoline engine (PHEV), and a method for determining a state of an alternating current (AC) electrical power source at a battery charger module have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. A battery charger module to be mounted in a vehicle for charging a vehicle battery, the battery charger module comprising:
a capacitor;
a direct current (DC) voltage sensor configured to sense a DC voltage across the capacitor; and
a controller configured to determine a rate of change of the sensed voltage, compare the rate of change of the sensed voltage to a slope threshold, and determine that an alternating current (AC) power supply is unstable if the rate of change of the sensed voltage fails to exceed the slope threshold.

2. The battery charger module of claim 1 wherein the controller is further configured to determine that the AC power supply is stable if the rate of change of the sensed voltage exceeds the slope threshold.

3. The battery charger module of claim 1 wherein the slope threshold is configurable.

4. The battery charger module of claim 1 wherein the capacitor comprises a bulk capacitor configured to receive a DC voltage from a rectifier configured to rectify an AC voltage from the AC power supply.

5. The battery charger module of claim 1 wherein diagnostic operations associated with an AC voltage sensor are halted based on a determination that the AC power supply is unstable.

6. The battery charger module of claim 2 wherein a state of an AC voltage sensor is determined based on a determination that the AC power supply is stable.

7. A battery charger module to be mounted in a vehicle for charging a vehicle battery, the battery charger module comprising a controller configured to:
determine a rate of change of a sensed direct current (DC) voltage across a capacitor;
compare the rate of change of the sensed voltage to a slope threshold; and
determine that an alternating current (AC) power supply is unstable when the rate of change of the sensed voltage fails to exceed the slope threshold.

8. The battery charger module of claim 7 wherein the controller is further configured to determine that the AC power supply is stable when the rate of change of the sensed voltage exceeds the slope threshold.

9. The battery charger module of claim 7 wherein the slope threshold is configurable.

10. The battery charger module of claim 7 wherein diagnostic operations associated with an AC voltage sensor are halted based on a determination that the AC power source is unstable.

11. The battery charger module of claim 8 wherein a state of an AC voltage sensor is determined based on a determination that the AC power supply is stable.

12. A method for determining a state of an alternating current (AC) electrical power supply at a battery charger module for charging a vehicle battery, the method comprising:
sensing a direct current (DC) voltage across a capacitor;
determining a rate of change of the sensed voltage;
comparing the rate of change of the sensed voltage to a slope threshold; and
determining that the AC power supply is unstable when the rate of change of the sensed voltage fails to exceed the slope threshold.

13. The method of claim 12 further comprising determining that the AC power supply is stable when the rate of change of the sensed voltage exceeds the slope threshold.

14. The method of claim 12 wherein the slope threshold is configurable.

15. The method of claim 12 wherein the capacitor comprises a bulk capacitor configured to receive a DC voltage from a rectifier configured to rectify an AC voltage from the AC power supply.

16. The method of claim 12 further comprising halting diagnostic operations associated with an AC voltage sensor based on a determination that the AC power supply is unstable.

17. The method of claim 13 further comprising determining a state of an AC voltage sensor based on wherein a determination that the AC power supply is stable.

* * * * *

UNITED STATES PATENT AND TRADEMARK OFFICE
CERTIFICATE OF CORRECTION

PATENT NO. : 10,012,703 B2
APPLICATION NO. : 14/067246
DATED : July 3, 2018
INVENTOR(S) : Gilbert et al.

Page 1 of 1

It is certified that error appears in the above-identified patent and that said Letters Patent is hereby corrected as shown below:

Column 8, Line 43, Claim 17:
After "an AC voltage sensor based on"
Delete "wherein".

Signed and Sealed this
Fourth Day of December, 2018

Andrei Iancu
*Director of the United States Patent and Trademark Office*